United States Patent

Gargini

[15] 3,657,494

[45] Apr. 18, 1972

[54] PRINTED CIRCUIT SWITCH ASSEMBLY WITH CONDUCTORS OF EQUAL LENGTH

[72] Inventor: Eric J. Gargini, West Drayton, England

[73] Assignee: Communications Patents Limited, London, England

[22] Filed: June 2, 1970

[21] Appl. No.: 42,674

[30] Foreign Application Priority Data

June 6, 1969 Great Britain......................28,871/69

[52] U.S. Cl. ................200/11 DA, 317/101 CM, 317/101 D

[51] Int. Cl.....................................H01h 19/58, H05k 1/04

[58] Field of Search ........................200/11 D, 168 S, 11 DA; 317/101 CM, 101 D; 335/205

[56] References Cited

UNITED STATES PATENTS

| | | | |
|---|---|---|---|
| 2,946,877 | 7/1960 | Nalette et al. | 200/11 DA X |
| 2,066,876 | 1/1937 | Carpenter et al. | 317/101 CM |
| 2,774,014 | 12/1956 | Henry, Jr. | 317/101 D |
| 2,905,920 | 9/1959 | Lutton | 317/101 D X |
| 2,907,924 | 10/1959 | Lutton | 317/101 D |
| 3,052,823 | 9/1962 | Anderson et al. | 200/11 D X |
| 3,081,416 | 3/1963 | Tuttle et al. | 317/101 CM X |
| 3,299,403 | 1/1967 | Young | 317/101 D X |
| 3,447,109 | 5/1969 | Shlesinger, Jr. | 335/205 |
| 3,454,736 | 7/1969 | Bogl | 200/168 S |
| 3,483,492 | 12/1969 | Mirbeth | 335/205 |
| 3,531,603 | 9/1970 | Ashman | 200/11 D |

*Primary Examiner*—J. R. Scott

*Attorney*—Laurence R. Brown

[57] ABSTRACT

There is disclosed an electrical switch comprising a printed circuit board assembly with replaceable printed boards having conductive screens between a plurality of boards stacked in a support member. Interconnections between boards are made at the edge of the boards.

2 Claims, 3 Drawing Figures

Patented April 18, 1972

3,657,494

2 Sheets-Sheet 1

INVENTOR
Eric J. Gargini
BY
Laurence R. Brown
ATTORNEY

Patented April 18, 1972

3,657,494

2 Sheets-Sheet 2

INVENTOR
Eric J. Gargini
BY
Laurence R. Brown
ATTORNEY

PRINTED CIRCUIT SWITCH ASSEMBLY WITH CONDUCTORS OF EQUAL LENGTH

This invention relates to electrical switch devices and seeks to provide and improved form thereof.

In accordance with the invention there is provided an electrical switch device which comprises a support member, a terminal assembly to which a plurality of electrical connections may be established and a plurality of conductors extending therefrom and means for associating with said conductors at spaced locations thereon each of a plurality of similar switch elements whereby corresponding contacts members of each of said switch elements are associated with the corresponding one of said conductors, the length of each conductor between its associated terminal of said terminal assembly and any one of the corresponding contact members of each switch element are substantially equal.

According to a more specific feature of the invention the support member is formed by one or an assembly of so called printed circuit boards and the plurality of conductors consist of conductive tracks defined thereon.

Conveniently, the rotary switch elements are releasably associated with the support member so that they may readily be changed, for example, for servicing purposes.

An electrical switch device in accordance with the present invention may be useful in a wired broadcasting system of the kind described in my U.S. Pat. application Ser. No. 39,497 filed May 21, 1970.

Figure 1:
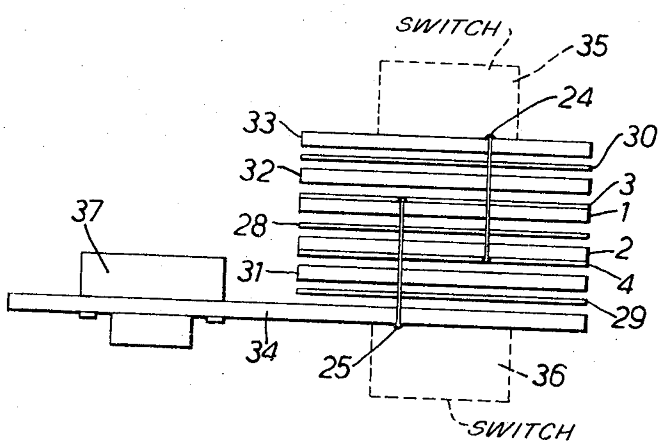
Figure 2:
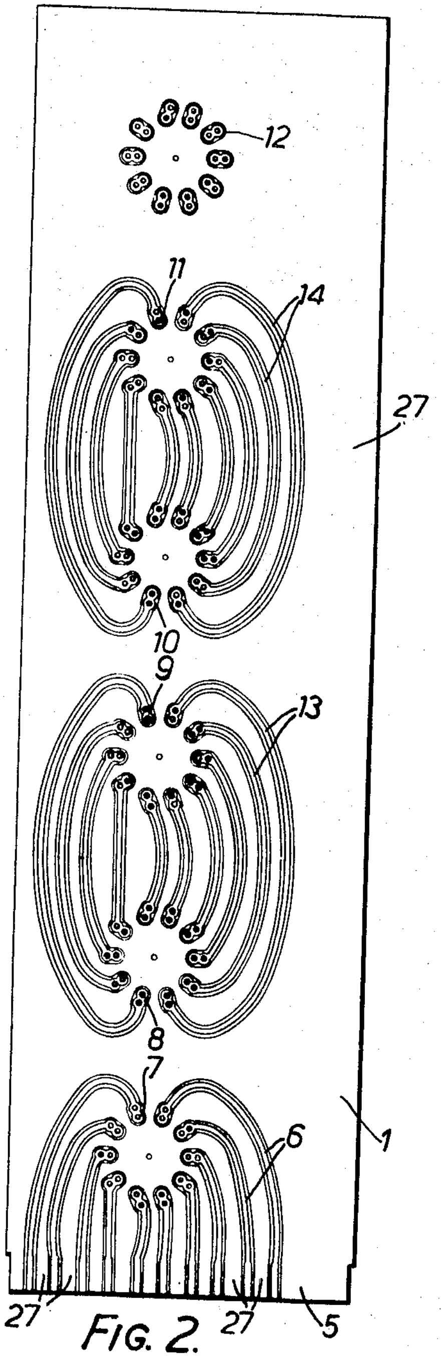
Figure 3:
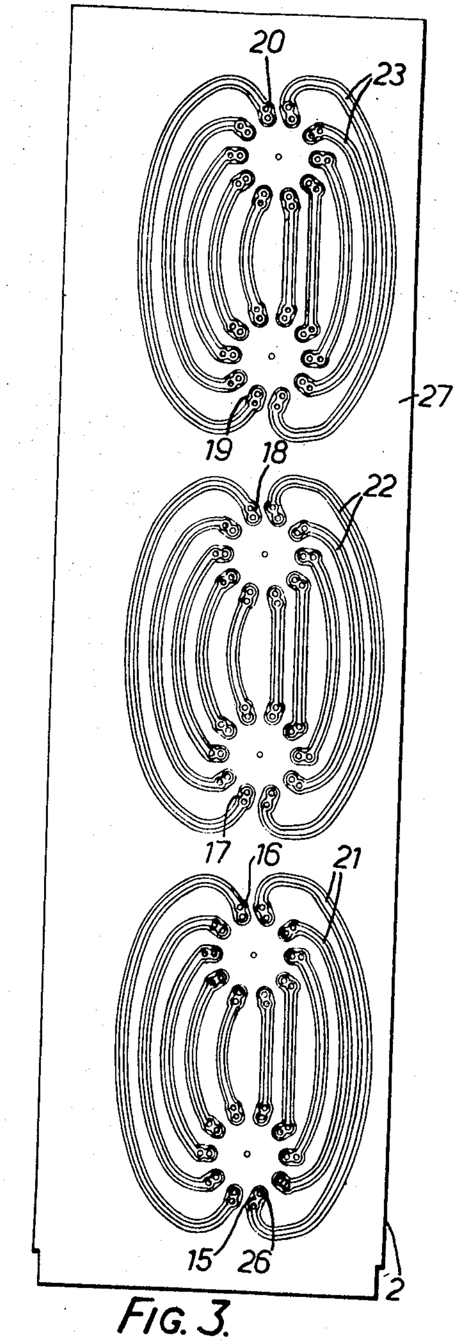

Further features and advantages of the present invention will become apparent from the following description of one particular embodiment thereof, given by way of example only, with reference to the accompanying drawing in which, FIG. 1 is an end elevation of an electrical switch device in accordance with the present invention, FIG. 2 is a plan view of one of a pair of printed circuit boards employed in the construction of the switch device shown in FIG. 1 and, FIG. 3 is a plan view of the other of the pair of printed circuit boards employed in the construction of the switch device shown in FIG. 1.

In FIG. 1 the electrical switch device comprises a support member formed by a pair of printed circuit boards 1, 2, which have conductive foil 3, 4, on their surfaces which are the more remote from each other. As will be seen more readily in FIGS. 2 and 3 the board 1 is provided at one end thereof with a terminal assembly 5, to which a plurality of electrical connections may be established. This terminal assembly is of a type particularly suited for use on printed circuit boards and is arranged for co-operation with a so-called "edge" connector, not shown. It will be appreciated that other types of terminal assembly may be employed. Extending from these terminals are a plurality of conductors 6 by means of which the terminals of said assembly are electrically connected to conductive areas 7. Further groups of conductive areas 8, 9, 10, 11, 12, are arranged at spaced locations on the support member the corresponding conductive areas of the groups 8, 9, being connected by the conductors 13, and those of the groups 10, 11, by the conductors 14. The member 2 is provided with similar groups of conductive areas 15, 16, 17, 18 19 and 20 which, when the members 1 and 2 are assembled together, positionally correspond to the groups of conductive areas 7, 8, 9, 10, 11 and 12. The corresponding conductive areas of the groups 15, 16 are connected by the conductors 21 while those of the groups 17, 18, are connected by the conductors 22 and those of the groups 19, 20, by the conductors 23.

The conductive areas of the groups 12 and 20 are connected to the terminals of the assembly 5 through the conductors 6, 21, 13, 22, 14 and 23 which are effectively connected in series by means of connections established from one board to another by means of conductive elements 24, 25 (see FIG. 1) which are passed through both the boards through the apertures 26. These conductive elements are conveniently conductive pins which are soldered to the respective conductive areas. The length of each conductive track provided on the boards 1 and 2 between any one of the terminals of the assembly 5 and any one of the corresponding conductive areas of the various groups are arranged to be substantially equal thereby to ensure identity of the electrical characteristics of the various conductors.

Preferably, the various conductors between the conductive areas of the groups are further isolated from each other by means of additional conductive areas 27 which are arranged to extend between each of said conductors and its neighbours. These conductive areas 27 are arranged in operation to be connected to the common conductor of the equipment, conveniently through additional contacts on the "edge connector" with which the terminal assembly 5 may be associated.

In order to improve the isolation between the various conductors there is interposed between the printed circuit boards 1 and 2 when they are assembled, a member 28 of conductive material, such for example, as copper foil. Yet further isolation and screening is provided by additional conductive members 29, 30, which are located on the other sides of the boards 1, 2, and separated therefrom by corresponding sheets 31 and 32 of insulating material.

The conductive members 24, 25, which serve to interconnect the two printed circuit boards are arranged to extend as shown, to the outside of the assembly of elements so that they may be associated with contact assemblies carried on the contact support members 33, 34, which are adapted to receive the switch elements shown in outline at 35, 36.

Conveniently, the switch elements 35, 36, are arranged so that three lie on one side of the assembly whilst the remaining three lie on the opposite side so as to enable a more compact assembly to be achieved.

The switch devices 35, 36 may consist of a single pole multi-position rotary switch which may conveniently itself be of the printed circuit type. Alternatively, the switches may be formed by an assembly of reed switch elements one of which is arranged to be actuated by a movable magnet such, for example, as described in my U.S. Pat. application Ser. No. 19,328 filed Mar. 13, 1970.

If desired, the member 34 may have an area larger than that of the remaining elements of the switch device so as to enable it to have associated therewith other components associated with electrical circuits connected to the switch device such, for example, as the transformer shown diagrammatically at 37.

I claim:

1. An electrical switch device which comprises two printed circuit type support members with circuit paths on each member providing separate sets of conductive areas registered to receive conductive pins for connecting together selected conductive areas of each member, a terminal assembly with a plurality of electrical connections to one set of conductive areas, a plurality of conductors respectively extending between further sets of conductive areas to provide interconnecting conductive paths, a plurality of similar switch elements with switching patterns having contact members at a plurality of switching positions corresponding to registered sets of conductive areas registered with said conductive areas, and means including conductive pins connecting together conductive areas on each member with a switching position of one of said switch elements for associating with said sets of conductive areas at spaced locations thereon each of said switch elements, said pins connecting corresponding contact areas to each of said switch elements which are thereby associated with the corresponding ones of said conductors to form a path to said terminal assembly for each switch position, the length of each said path between its associated terminal of said terminal assembly and any one of the corresponding contact members of each switch element being substantially equal.

2. An electrical switch device as claimed in claim 1 wherein the switch elements are formed by a single-pole multi-position rotary switch.

* * * * *